INVENTOR.
ALAN R. PEARLMAN
BY
William J. Flynn
ATTORNEY

May 29, 1956 A. R. PEARLMAN 2,748,274

TRANSISTOR OSCILLATOR WITH CURRENT TRANSFORMER FEEDBACK NETWORK

Filed May 23, 1955 2 Sheets-Sheet 2

INVENTOR.
ALAN R. PEARLMAN

BY

William J. Flynn
ATTORNEY 2,748,274

TRANSISTOR OSCILLATOR WITH CURRENT TRANSFORMER FEEDBACK NETWORK

Alan R. Pearlman, Brighton, Mass., assignor, by mesne assignments, to Clevite Corporation, Cleveland, Ohio, a corporation of Ohio Application May 23, 1955, Serial No. 510,485

14 Claims. (Cl. 250—36)

This invention relates to a transistor oscillator.

It is an object of this invention to provide a novel and improved transistor oscillator which is particularly adapted for use in a power supply for converting low voltage D. C. to a higher voltage.

Another object of this invention is to provide a novel transistor oscillator having improved efficiency under partial load conditions and at full load.

Another object of this invention is to provide a novel square wave transistor oscillator having good voltage regulation.

Another object of this invention is to provide a novel transistor oscillator capable of supplying power to loads which require high surge starting currents, such as lamps or capacitors.

A further object of this invention in its general aspect is to provide a novel transistor oscillator capable of maintaining oscillations under short circuit loads.

Another object of the present invention in a particular aspect is to provide a novel transistor oscillator having provision for maintaining oscillations under load or no load.

The foregoing objects are accomplished in the present invention by the provision of an audio frequency square wave oscillator which includes a pair of transistors connected in push-pull relation and transformer-coupled to the load and having a current transformer feedback network between the output and input of each transistor for establishing oscillations.

Other and further objects and advantages of the present invention will be apparent from the following detailed description of certain preferred embodiments illustrated in the accompanying drawings.

Figure 1:
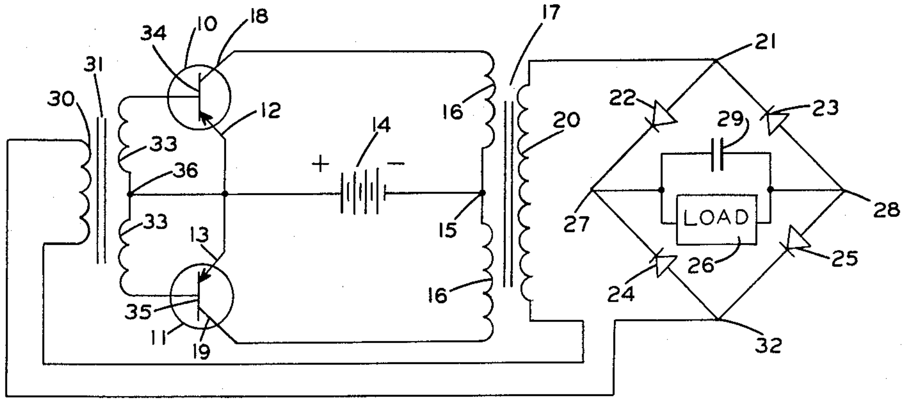
Figure 1 is a circuit diagram of a common-emitter transistor oscillator according to the present invention.

Referring to Fig. 1, the oscillator in accordance with this embodiment of the present invention comprises a pair of P-N-P transistors 10 and 11 connected in push-pull relation with their respective emitters 12 and 13 connected directly to the positive terminal of a direct current low voltage source, such as a 6 volt, 12 volt or 28 volt battery 14. The negative terminal of this battery is connected directly to the center tap 15 on the primary winding 16 of a transformer 17. Transformer 17 is provided with a core of iron, ferrite or other suitable magnetic material. The opposite ends of the transformer primary 16 are connected to the respective collector electrodes 18 and 19 of the transistors 10 and 11.

The secondary winding 20 of transformer 17, which is inductively coupled to the primary winding 16, has one of its terminals connected directly to one terminal 21 of a full-wave bridge rectifier comprising rectifier diodes 22, 23, 24 and 25 connected as shown in Fig. 1. The load 26 is connected across terminals 27 and 28, which are located at the juncture of rectifier elements 22 and 24 and the juncture of rectifier elements 23 and 25, respectively. A filter capacitor 29 is connected in parallel with the load. The secondary winding 20 has a number of turns sufficient to provide the desired voltage step-up for operating the load.

The other terminal of the transformer secondary winding 20 is connected through the primary winding 30 of a feedback transformer 31 to the opposite terminal 32 of the rectifier bridge. The feedback primary winding 30 is thus connected in series with the secondary winding 20 of transformer 17, so that load current flows through the feedback primary 30. However, the feedback primary winding 30 is not inductively coupled to the primary winding 16 of transformer 17. The feedback transformer 31 is provided with a secondary winding 33 inductively coupled to the feedback primary winding 30 and having its opposite ends connected directly to the base electrodes 34 and 35 of the transistors 10 and 11, respectively. The secondary winding 33 has a turns ratio with respect to primary winding 30 on transformer 31 such that proper driving current is supplied to transistors 10 and 11 when full load current is drawn. A center tap 36 on the feedback secondary 33 is connected directly to both emitter electrodes 12 and 13. The feedback transformer 31 is provided with an iron or ferrite core, preferably. Because it is working into the low impedance of the input circuit of a transistor the feedback transformer need have only a small core and relatively few turns to have sufficient low frequency response.

Each of the transistors 10 and 11 preferably is of a type able to maintain high gain at emitter currents of the order of amperes. In one desirable embodiment each of these transistors is a P–N–P alloy junction transistor as disclosed and claimed in the co-pending application of Neville H. Fletcher, Serial No. 477,627, assigned to the same assignee as the present invention. Alternatively, other transistors might be employed. In the case of N–P–N transistors the bias connections for the emitter and collector electrodes would be reversed from the arrangement shown in Fig. 1.

Each of the transistors in Fig. 1 comprises a semiconductor body contacted by the emitter, base and collector electrodes. Each base electrode makes low resistance, ohmic contact with the semiconductor body. The emitter electrode makes rectifier contact with the semiconductor body and is biased by battery 14 for current conduction in the forward or low resistance direction. The collector electrode makes rectifier contact with the semiconductor body and is biased for current conduction in the reverse or high resistance direction.

With the load connected in circuit as shown, due to unavoidable asymmetry one or the other of the transistors 10 or 11 spontaneously will start to conduct current. The following is offered as an explanation of the action which takes place in the oscillator under certain operating conditions without, however, intending to limit the present invention to this particular theory of operation:

Assuming that transistor 10 begins to conduct first, the change of current at colelctor 18 produces a voltage across the upper half of the transformer primary winding 16 which drives the potential at this collector electrode increasingly more positive than the potential at the negative terminal of battery 14. The voltage across the transformer primary 16 induces in the transformer secondary winding 20 a current which produces a voltage across the primary winding 30 of the feedback transformer 31. This, in turn, induces a voltage across the secondary winding 33 in the feedback transformer 31 which drives the base 34 negative with respect to emitter 12, thereby causing the base 34 to draw more current. This is reflected as a further increase in the current at collector 18, so that the voltage at collector 18 approaches the voltage at emitter 12. Accordingly, the voltage drop across the uper half of the primary winding 16 of transformer 17 becomes substantially equal to the battery voltage. This condition prevails as the current at collector 18 continues to increase.

During this time the voltage induced in the secondary winding 33 on the feedback transformer 31 drives the base 35 of the other transistor 11 positive with respect to emitter 13, thereby maintaining transistor 11 substantially non-conducting.

While the current at collector 18 increases cumulatively, as described above, it cannot increase abruptly because of the inductance of the upper half of the primary winding 16 through which it flows. Rather, this collector current increases exponentially in accordance with the L/R time constant of the circuit, L being the inductance of the upper half of the primary winding 16, and R being the sum of the effective resistance of the upper half of primary winding 16 and the collector impedance of transistor 10. This collector current increases relatively slowly and exponentially toward a final saturation value, which is determined by the forward bias voltage between the base and the emitter of transistor 10.

As current saturation is reached at collector 18, the voltage across the upper half of the primary winding 16 of transformer 17 drops to substantially zero because the rate of change of collector current is now substantialy zero. When this happens, the induced voltage in the secondary winding 20 of transformer 17 also drops to substantially zero, thereby reducing to substantially zero the current supplied to the load. As a result, the driving current supplied through the feedback transformer 31 to transistor 10 ceases and the reverse bias on transistor 11 is removed.

The foregoing sequence produces a half cycle of substantially square wave voltage across the secondary winding 20 on transformer 17 which operates the load.

Since the forward bias on transistor 10 has been removed, the current at collector 18 decreases. This decrease takes place at a much more rapid rate than the current build-up at collector 18 because now transistor 10 presents a high collector impedance, so that the L/R time constant for this circuit is now much shorter. The rapid decay of the curenrt at collector 18 induces a voltage across the primary winding 16 of transformer 17 opposite in sign to that produced by the initial conduction at collector 18. The resultant voltage induced across the secondary winding 20 on transformer 17 produces a current through the primary winding 30 on the feedback transformer 31 which induces a voltage across the secondary winding 33 on feedback transformer 31 which forward biases the emitter-base diode portion of transistor 11, tending to cause this transistor to conduct in the forward direction. Accordingly, there is produced at collector 19 a positive current which increases in exponential fashion, inducing a voltage which is applied through transformers 17 and 31 to the base-emitter diode portion of transistor 11 tending to maintain transistor 11 conducting. At the same time transistor 10 is reverse-biased by this driving voltage and hence is non-conducting.

The potential at collector 19 rapidly approaches the emitter potential, so that the voltage across the lower half of the primary winding 16 on transformer 17 becomes substantially equal to the battery voltage as the current at collector 19 continues to increase. Thus, another half cycle of substantially square wave voltage is applied to the load.

When current saturation is reached at collector 19, the voltage across the lower half of the transformer primary 16 drops to substantially zero, as does the driving voltage applied to transistor 11. With the removal of this driving voltage the current at collector 19 begins to decrease rapidly, inducing a voltage across the primary winding 16 of transformer 17 which causes transistor 10 to again begin to conduct.

In this manner the transistors 10 and 11 conduct in alternate sequence, producing alternate half cycles of square wave voltage which after rectification in the full-wave bridge rectifier is applied as D. C. to the load. The magnitude of the D. C. voltage applied to the load depends upon the battery voltage and the turns ratio in transformer 17, of course.

In the operation of this circuit the amplitude of the driving current fed back to the conducting transistor varies with the load current. At lower load impedances the load current increases, as does the driving current fed back to sustain oscillations. Thus, at very low or short circuit load impedances, the oscillator will continue to function; however, with poor voltage regulation and efficiency. At higher load impedances the load current is smaller and the driving current fed back to the conducting transistor also is reduced. As a result of this action the power losses at partial loads are substantially reduced, thereby increasing the efficiency of the oscillator. Also, very good efficiency is obtained when operating under full load. In practice, the maximum efficiency, which occurs at full load, has been as high as 85%.

The voltage regulation in this circuit is excellent, being substantially independent of variations in the load impedance up to the full load power rating of the oscillator. The amplitude of the substantially square wave output across one-half the transformer primary is substantially equal to the battery voltage under various load conditions.

This circuit has the additional advantage that it is possible to independently ground one side of the battery and one side of the output.

In the event a full wave rectifier system is used in the output, the primary winding on the feedback transformer can be placed in series with one of the rectifier elements. However, in such case since only alternate half cycles of the alternating current in the output would flow through that rectifier element the turns ratio in the feedback transformer would have to be doubled. Alternatively, a split primary winding on the feedback transformer might be used, with each half in series with a diffrerent rectifier element.

Figure 2:
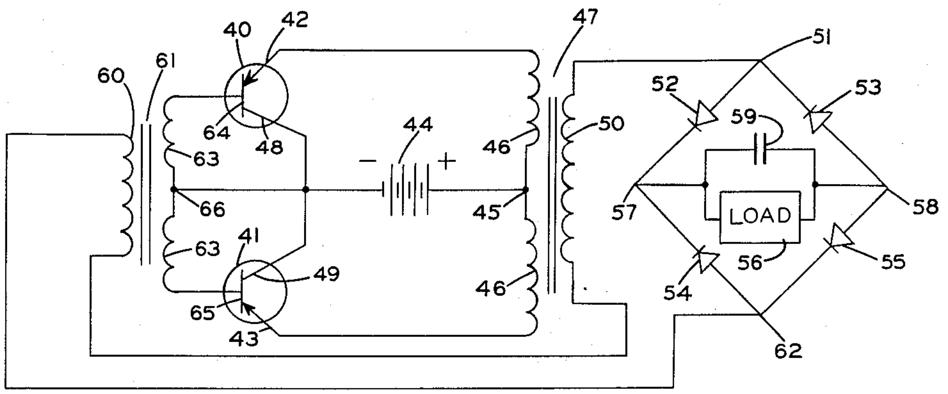
Figure 2 is a circuit diagram of a common-collector transistor oscillator in accordance with the present invention.

In Fig. 2 there is shown a second embodiment of the present invention embodying a push-pull common collector transistor oscillator. Referring to this figure, there are provided a pair of P–N–P transistors 40 and 41 of the same type as in Fig. 1, having their respective collector electrodes 48 and 49 connected directly to the negative terminal of battery 44. The positive terminal of this battery is connected to the center tap 45 on the primary winding 46 of a transformer 47. The opposite terminals of this transformer primary winding are connected to the respective emitter electrodes 42 and 43 of the transistors.

The secondary winding 50 on transformer 47, which is inductively coupled to the primary winding 46, has one of its terminals connected directly to one terminal 51 of a full wave bridge rectifier comprising rectifier diodes 52, 53, 54 and 55 connected as shown in Fig. 2. The load 56 and a filter capacitor 59 are connected in parallel with each other between the points 57 and 58 on the rectifier bridge, which are at the juncture of rectifier elements 52 and 54 and at the juncture of rectifier elements 53 and 55, respectively. The secondary winding 50 has a number of turns sufficient to provide the desired voltage step-up for operating the load.

The other terminal of the transformer secondary winding 50 is connected through the primary winding 60 of a feedback transformer 61 to the opposite terminal 62 of the rectifier bridge. The feedback primary winding 60 is thus connected in series with the secondary winding 50 of transformer 47, so that load current flows through the feedback primary 60. The feedback primary winding 60 is not inductively coupled to the primary winding 46 on transformer 47. A feedback secondary winding 63 on transformer 61 is inductively coupled to the feedback primary winding 60 and has its opposite ends connected directly to the base electrodes 64 and 65 of transistors 40 and 41, respectively. The number of turns on feedback secondary winding 63 exceeds the number of turns on the feedback primary winding 60 by an amount sufficient to provide feedback driving current necessary to establish oscillations. A center tap 66 on the feedback secondary winding 63 is connected directly to both collectors 48 and 49.

The operation of the Fig. 2 oscillator is essentially similar to the operation of the Fig. 1 embodiment, which is described in detail above. Accordingly, it is considered that a detailed description of the operation of the Fig. 2 oscillator is unnecessary.

Figure 3:
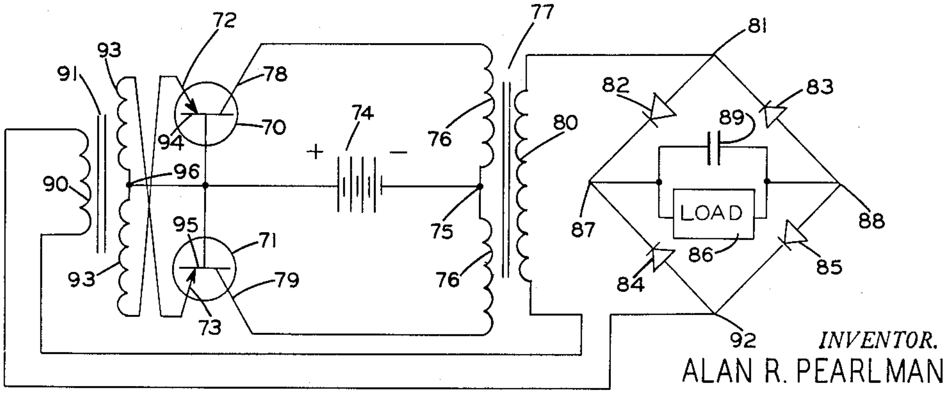
Figure 3 is a circuit diagram of a common-base transistor oscillator in accordance with the present invention.

A third embodiment of the present invention, shown in Fig. 3, is a common-base oscillator provided with a pair of P–N–P transistors 70 and 71 of the type described above, having their respective base electrodes 94 and 95 connected directly to the positive terminal of a battery 74. The negative terminal of this battery is connected directly to the center tap 75 on the primary winding 76 of transformer 77. The opposite ends of this transformer primary winding are connected to the respective collector electrodes 78 and 79 of the transistors 70 and 71.

The secondary winding 80 on transformer 77, which is inductively coupled to the primary winding 76, has one of its ends connected directly to one terminal 81 of a full wave bridge rectifier comprising rectifier diodes 82, 83 and 85 connected as shown in Fig. 3 The load 86 is connected in parallel with a filter capacitor 89 across the points 87 and 88 on the rectifier bridge, which are at the juncture of the rectifier elements 82 and 84 and the juncture of the rectifier elements 83 and 85, respectively. The secondary winding 80 has sufficient turns to provide the desired voltage step-up for operating the load.

The other terminal of the transformer secondary winding 80 is connected through the primary winding 90 of a feedback transformer 91 to the opposite terminal 92 of the rectifier bridge. The feedback primary winding 90 is thus connected in series with the secondary winding 80 of transformer 17, so that load current flows through the feedback primary 90. However, the feedback primary winding 90 is not inductively coupled to the primary winding 76 of transformer 77. The feedback transformer 91 is provided with a secondary winding 93 inductively coupled to the feedback primary winding 90 and having its opposite ends connected directly to the emitter electrodes 72 and 73 of the transistors 70 and 71, respectively, as shown in Fig. 3. The feedback secondary winding 93 has a turn ratio with respect to feedback primary winding 90 so as to provide a suitable voltage ratio for supplying the driving current required to establish oscillations. A center tap 96 on the feedback secondary winding 93 is connected directly to both base electrodes 94 and 95. It will be noted that the connections from the ends of the feedback secondary winding 93 to the transistors in Fig. 3 are reversed from the corresponding connections in Fig. 1. This is necessary for the desired energy feedback action to take place because the emitter and base connections for the transistors in Fig. 3 are reversed from those in Fig. 1.

Figure 4:
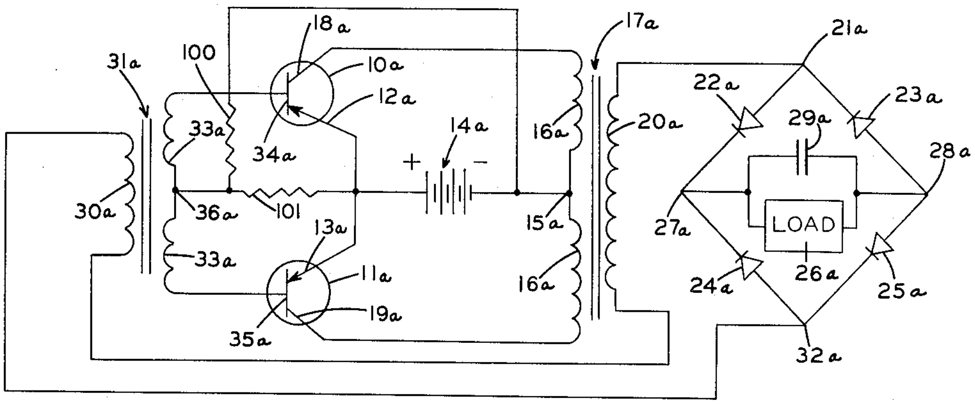
Figures 4, 5 and 6 are circuit diagrams of common-emitter, common-collector and common-base transistor oscillators, respectively, having provision for maintaining oscillations under no load conditions.
Figure 5:
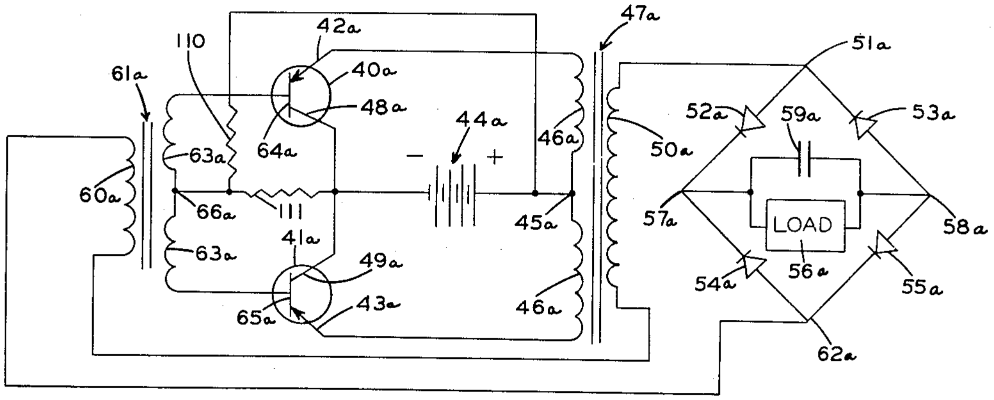
Figure 6:
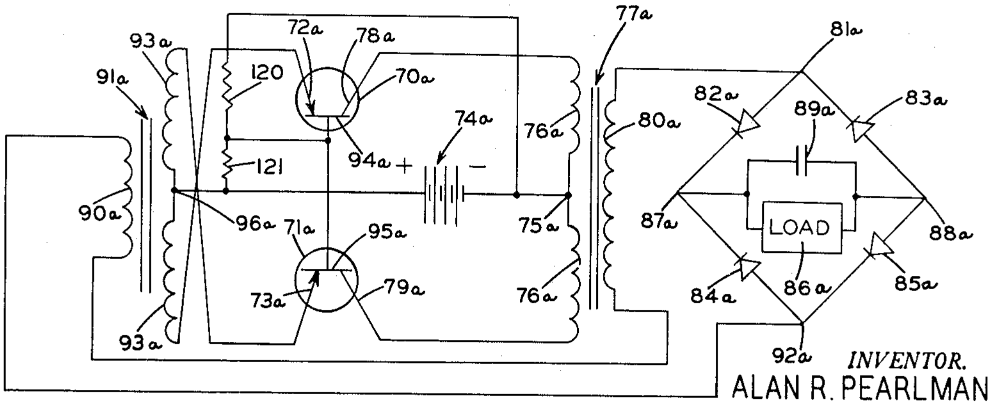

Each of the embodiments of the present invention shown in Figs. 1–3 is capable of maintaining oscillations only under load. If the load is removed there is no load current, and hence no feedback energy for maintaining oscillations.

Where it is desired to provide an oscillator capable of maintaining oscillations under no load, either of the embodiments shown in Figs. 4, 5 and 6 may be adopted. In each of these embodiments the elements corresponding to those in Figs. 1, 2 and 3, respectively are designated by the same reference numerals, with the subscript "*a*" added.

In the Fig. 4 oscillator there is provided a resistance network for maintaining oscillations, composed of a pair of resistors 100 and 101 connected in series with each other across the battery **14*a*. The juncture of these resistors is connected directly to the center tap 36*a* on the feedback secondary winding 33*a*. In one practical embodiment, resistor 101 is of the order of 1 to 10 ohms, while resistor 100 is chosen so that the voltage of battery 14 divided by the resistance of resistor 100** is of the order of 50 to 100 milliamperes current. In other respects the Fig. 4 circuit is identical to that of Fig. 1.

In the operation of the Fig. 4 circuit, current drawn from the battery flows through resistor 100 and then divides among resistor 101 and the input impedances of the two transistors **10*a* and 11*a***. Since these resistors are series-connected across the battery they draw current even if neither transistor is conducting and a portion of this current is supplied as driving current to the emitter-base diode portion of the transistor which first begins to conduct. This enables the positive initiation of oscillations, even under conditions of no load. Also, the same action takes place when one transistor cuts off and the other is just beginning to conduct. Therefore, a more positive maintenance of oscillations is achieved.

In the absence of this resistance network there is a tendency for the circuit to oscillate intermittently under no load or very light load, because current conduction by one of the transistors induces a voltage across the secondary winding **20*a* of transformer 17*a* which starts a large charging current flowing to capacitor 29*a*. This charging current must also flow through the primary winding 30*a* of feedback transformer, which induces driving current to the base electrode of the conducting transistor, thus tending to set up oscillations. However, unless there is a load impedance connected across capacitor 29*a*** the oscillations will cease as soon as this capacitor becomes fully charged. Therefore, in order to maintain oscillations under no load or very light load it is necessary to provide driving current in some other manner and the above-described resistance network is very effective for this purpose.

The action which takes place in the Fig. 5 oscillator and in the Fig. 6 oscillator is essentially the same.

In Fig. 5, a pair of resistors 110 and 111 are connected in series with each other across the battery **44*a*, with the juncture of these resistors being connected directly to the center tap 66*a* on the feedback secondary winding 63*a***. In other respects, the Fig. 5 circuit is identical to that of Fig. 2.

In Fig. 6, a pair of resistors 120 and 121 are connected in series with each other across the battery **74*a* and the juncture between these resistors is connected directly to the respective base electrodes 94*a* and 95*a*. The center tap 96*a* on the feedback secondary winding 93*a* is connected directly to the positive terminal of battery 74*a***. In other respects, the Fig. 6 oscillator is identical to that of Fig. 3.

While there have been described herein and illustrated in the accompanying drawings certain preferred embodiments of the present invention, it is to be understood that various modifications, omissions and refinements which depart from the disclosed embodiments may be adopted without departing from the spirit and scope of the present invention. For example, where it is desired to provide a single-ended oscillator of lower power output this may be done in each of the disclosed embodiments by eliminating one of the transistors.

I claim:

1. A transistor oscillator comprising a transistor, power supply connections for the transistor, input and output circuits for the transistor, a load connected in said output circuit, a feedback transformer having a primary winding coupled to the load so that the current through said primary winding varies with the load current, and a secondary winding on said feedback transformer inductively coupled to said primary winding and connected in said input circuit to supply regenerative feedback energy to the transistor.

2. A transistor oscillator comprising a transistor having an input and an output, power supply connections for the transistor, a load transformer-coupled to the transistor output, a feedback transformer having a primary winding coupled to the load to carry a current which varies with the load current, and a secondary winding on said feedback transformer inductively coupled to said primary winding and connected to the transistor input to supply driving current to the transistor for maintaining oscillations.

3. A transistor oscillator comprising a transistor having an input and an output, power supply connections for the transistor, an output transformer having a primary winding connected across the transistor output, a secondary winding on said output transformer inductively coupled to said primary winding, a feedback transformer having a primary winding connected to the secondary winding on the output transformer, and a secondary winding on said feedback transformer inductively coupled to said primary winding on the feedback transformer and coupled to the transistor input to supply feedback energy thereto.

4. A transistor oscillator comprising a pair of transistors connected in push-pull relation and each having an input and an output, an output transformer having a primary winding connected across the transistor outputs, a secondary winding on said output transformer inductively coupled to said primary winding, a load coupled to said secondary winding, a feedback transformer having a primary winding coupled to the load to carry a current which varies with the load current, and a secondary winding on the feedback transformer inductively coupled to said primary winding on the feedback transformer and connected across the transistor inputs to supply regenerative feedback energy thereto which varies with the load current.

5. A transistor oscillator comprising a pair of transistors connected in push-pull relation and each comprising a semiconductor, a base electrode making ohmic contact with the semiconductor, and an emitter electrode and a collector electrode each making rectifier contact with the semiconductor, power supply connections for the transistors, an output transformer having its ends connected respectively to a pair of corresponding rectifier contact electrodes on the transistors, a center tap on said primary winding connected to one of said power supply connections, the other power supply connection being coupled to a pair of corresponding other electrodes on the transistors, a secondary winding on the output transformer inductively coupled to said primary winding, a load coupled to said secondary winding, a feedback transformer having a primary winding coupled to the load to carry a current which varies with the load current, a secondary winding on said feedback transformer inductively coupled to the primary winding thereon, a center tap on said secondary winding on the feedback transformer having a connection to said other power supply connection, and the ends of said secondary winding on the feedback transformer being connected respectively to the remaining electrodes on the transistors to supply driving current to the transistors for maintaining oscillations.

6. The oscillator of claim 5, wherein there is additionally provided a capacitor connected in parallel with the load.

7. The oscillator of claim 5, wherein there are additionally provided a pair of resistive impedance elements connected in series with each other across the power supply connections, one of said resistive impedance elements being connected between the center tap on the secondary winding on the feedback transformer and the second-mentioned pair of corresponding electrodes on the transistors.

8. The oscillator of claim 7, wherein there is additionally provided a capacitor connected in parallel with the load.

9. A transistor oscillator comprising a pair of transistors connected in push-pull relation and each comprising a semiconductor, a base electrode making ohmic contact with the semiconductor, and an emitter electrode and a collector electrode each making rectifier contact with the semiconductor, power supply connections for the transistors, an output transformer having a primary winding with its ends connected respectively to the collector electrodes on the transistors, a center tap on said primary winding connected directly to one of said power supply connections, the other power supply connection being connected directly to both emitter electrodes on the transistors, a secondary winding on the output transformer inductively coupled to said primary winding, a load coupled to said secondary winding, a feedback transformer having a primary winding coupled to the load to carry a current which varies with the load current, a secondary winding on the feedback transformer inductively coupled to said primary winding thereon, a center tap on the secondary winding on the feedback transformer having a connection to said other power supply connection, and connections from the ends of the secondary winding on the feedback transformer respectively to the base electrodes on the transistors to supply driving current to the transistors for maintaining oscillations.

10. The oscillator of claim 9, wherein there are additionally provided a pair of resistive impedance elements connected in series with each other across the power supply connections, the juncture of said resistive impedance elements being connected directly to the center tap on the secondary winding on the feedback transformer.

11. A transistor oscillator comprising a pair of transistors connected in push-pull relation and each comprising a semiconductor, a base electrode making ohmic contact with the semiconductor, and an emitter electrode and a collector electrode each making rectifier contact with the semiconductor, power supply connections for the transistors, an output transformer having a primary winding with its ends connected respectively to the emitter electrodes on the transistors, a center tap on said primary winding connected directly to one of said power supply connections, the collector electrodes on the transistors being directly connected to the other power supply connection, a secondary winding on the output transformer inductively coupled to said primary winding, a load coupled to said secondary winding, a feedback transformer having a primary winding coupled to the load to carry a current which varies with the load current, a secondary winding on the feedback transformer inductively coupled to said primary winding thereon, a center tap on the secondary winding on the feedback transformer having a connection to said other power supply connection, and connections from the ends of the secondary winding on the feedback transformer respectively to the base electrodes on the transistors to supply driving current to the transistors for maintaining oscillations.

12. The oscillator of claim 11, wherein there are additionally provided a pair of resistive impedance elements connected in series with each other across the power supply connections, the juncture of said resistive impedance elements being connected directly to the center tap on the secondary winding on the feedback transformers.

13. A transistor oscillator comprising a pair of transistors connected in push-pull relation and each comprising a semiconductor, a base electrode making ohmic contact with the semiconductor, and an emitter electrode and a collector electrode each making rectifier contact with the semiconductor, power supply connections for the transistors, an output transformer having a primary winding with its ends connected respectively to the collector electrodes on the transistors, a center tap on said primary winding connected directly to one of said power supply connections, the base electrodes on the transistors being coupled to the other power supply connection, a secondary winding on the output transformer inductively coupled to said primary winding, a load coupled to said secondary winding, a feedback transformer having a primary winding coupled to the load to carry a current which varies with the load current, a secondary winding on the feedback transformer inductively coupled to said primary winding thereon, a center tap on the secondary winding on the feedback transformer connected directly to said other power supply connection, and the ends of the secondary winding on the feedback transformer being connected respectively directly to the emitter electrodes on the transistors to supply driving current to the transistors for maintaining oscillations.

14. The oscillator of claim 13, wherein there are additionally provided a pair of resistive impedance elements connected in series with each other across the power supply connections, the juncture of said resistive impedance elements being connected directly to the base electrodes on the transistors.

No references cited.